United States Patent
Hwang et al.

(10) Patent No.: US 8,148,708 B2
(45) Date of Patent: Apr. 3, 2012

(54) RESISTIVE MEMORY DEVICE AND METHOD OF FABRICATING THE SAME

(75) Inventors: Yun-Taek Hwang, Icheon-si (KR); Yu-Jin Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 483 days.

(21) Appl. No.: 12/344,443

(22) Filed: Dec. 26, 2008

(65) Prior Publication Data
US 2010/0117041 A1   May 13, 2010

(30) Foreign Application Priority Data
Nov. 10, 2008 (KR) .......................... 10-2008-0110954

(51) Int. Cl.
*H01L 45/00* (2006.01)
(52) U.S. Cl. .. 257/3; 257/4; 257/5; 257/43; 257/E21.52; 257/E45.003; 438/104; 438/482; 438/692; 438/903; 977/762; 977/843; 977/943
(58) Field of Classification Search .................. 257/1–5, 257/E21.52, 43, E45.001–E45.003; 438/104, 438/482, 691, 692, 903
See application file for complete search history.

(56) References Cited

U.S. PATENT DOCUMENTS

| | | | |
|---|---|---|---|
| 7,405,420 B1 * | 7/2008 | Wong et al. ..................... 257/4 |
| 7,667,999 B2 * | 2/2010 | Herner et al. .................. 365/148 |
| 8,013,363 B2 * | 9/2011 | Bertin et al. ................... 257/206 |
| 2006/0034116 A1 * | 2/2006 | Lam et al. ..................... 365/151 |
| 2006/0250837 A1 | 11/2006 | Herner et al. |
| 2007/0132049 A1 | 6/2007 | Stipe |
| 2007/0183189 A1 | 8/2007 | Nirschl |
| 2007/0268042 A1 | 11/2007 | Paul |
| 2007/0278530 A1 | 12/2007 | Seidl |
| 2008/0128853 A1 * | 6/2008 | Choi et al. ..................... 257/530 |
| 2009/0200536 A1 * | 8/2009 | Van Schaijk et al. ............. 257/4 |
| 2010/0072459 A1 * | 3/2010 | Bertin et al. .................... 257/24 |
| 2010/0102291 A1 * | 4/2010 | Xu ................................... 257/4 |
| 2011/0069525 A1 * | 3/2011 | Fukumizu et al. ............. 365/63 |
| 2011/0260290 A1 * | 10/2011 | Kalra et al. ..................... 257/538 |

FOREIGN PATENT DOCUMENTS

| | | |
|---|---|---|
| KR | 10-2007-0115707 | 12/2007 |
| KR | 1020080043173 | 5/2008 |
| WO | WO 2006/003620 A1 * | 1/2006 |
| WO | 2006/059313 | 6/2006 |

OTHER PUBLICATIONS

Korean Office Action for application No. 10-2008-0110954.
German Office Action.

* cited by examiner

*Primary Examiner* — Anh Phung
*Assistant Examiner* — Michael Lulis
(74) *Attorney, Agent, or Firm* — Lowe Hauptman Ham & Berner, LLP

(57) ABSTRACT

A resistive memory device includes a first conductive line on a substrate, a vertical selection diode comprising a nanowire or a nanotube and being arranged over the first conductive line, a resistive element including a resistive layer arranged over the vertical selection diode; and a second conductive line arranged over the resistive element.

18 Claims, 8 Drawing Sheets

RESISTIVE MEMORY DEVICE AND METHOD OF FABRICATING THE SAME

CROSS-REFERENCE TO RELATED APPLICATIONS

The present application claims priority of Korean patent application number 10-2008-0110954, filed on Nov. 10, 2008, which is incorporated herein by reference in its entirety.

BACKGROUND

The disclosure relates to a memory device and a method of fabricating such a memory device, and more particularly, to a resistive memory device like a nonvolatile resistive random access memory (ReRAM) device and a method of fabricating the same.

Recently, next-generation memory devices substituted for dynamic random access memory (DRAM) devices and flash memory devices have been researched.

One of the next-generation memory devices is a resistive memory device using a material capable of being switched between at least two resistance states by a sharp variance of resistances in response to a bias applied to the material. Hereafter, the material is referred to as a resistive layer. A binary oxide including a transition metal oxide or a perovskite material is used as the resistive layer.

In general, each cell in the resistive memory device has a selection element for selecting a that cell and a resistance-variable resistive element electrically connected to the selection element. A selection transistor or a selection diode is used as the selection element. In addition, the resistive element includes an upper electrode, a lower electrode and the resistive layer interposed between the upper electrode and the lower electrode.

Recently, a memory cell structure where a vertical selection diode and a resistive element are stacked one upon another has been suggested. Particularly, the vertical selection diode in the suggested structure has a binary oxide structure in which an n-type oxide such as $TiO_2$ and a p-type oxide such as NiO are stacked one upon another.

However, using a binary oxide for the vertical selection diode causes some problems in that a current density through the diode is not sufficiently high and a rectifying characteristic through the diode is not sufficiently good for certain applications.

SUMMARY

In accordance with an embodiment, a resistive memory cell comprises: a first conductive line on a substrate; a vertical selection diode comprising a nanowire or a nanotube and being arranged over the first conductive line; a resistive element including a resistive layer arranged over the vertical selection diode; and a second conductive line arranged over the resistive element.

In accordance with another embodiment, a resistive memory device with a cross-point structure comprises: first conductive lines arranged in parallel over a substrate; second conductive lines arranged in parallel, spaced upwardly from the first conductive lines and extending across the first conductive lines; and a plurality of first resistive memory cells each being interposed between one of the first conductive lines and one of the second conductive lines at a cross-point of the first conductive line and the second conductive line. Each first resistive memory cell comprises a first vertical selection diode and a first resistive element stacked one upon another. The first vertical selection diode comprises a nanowire or a nanotube, and the first resistive element includes a first resistive layer.

In accordance with a further embodiment, a method of fabricating a resistive memory device comprises: forming a first conductive line over a substrate; forming a vertical selection diode by growing a nanowire or a nanotube over the first conductive line; forming a resistive element including a resistive layer over the vertical selection diode; and forming a second conductive line over the resistive element.

BRIEF DESCRIPTION OF THE DRAWINGS

Various embodiments are illustrated by way of example, and not by limitation, in the figures of the accompanying drawings.

DESCRIPTION OF EMBODIMENTS

Figure 1A:
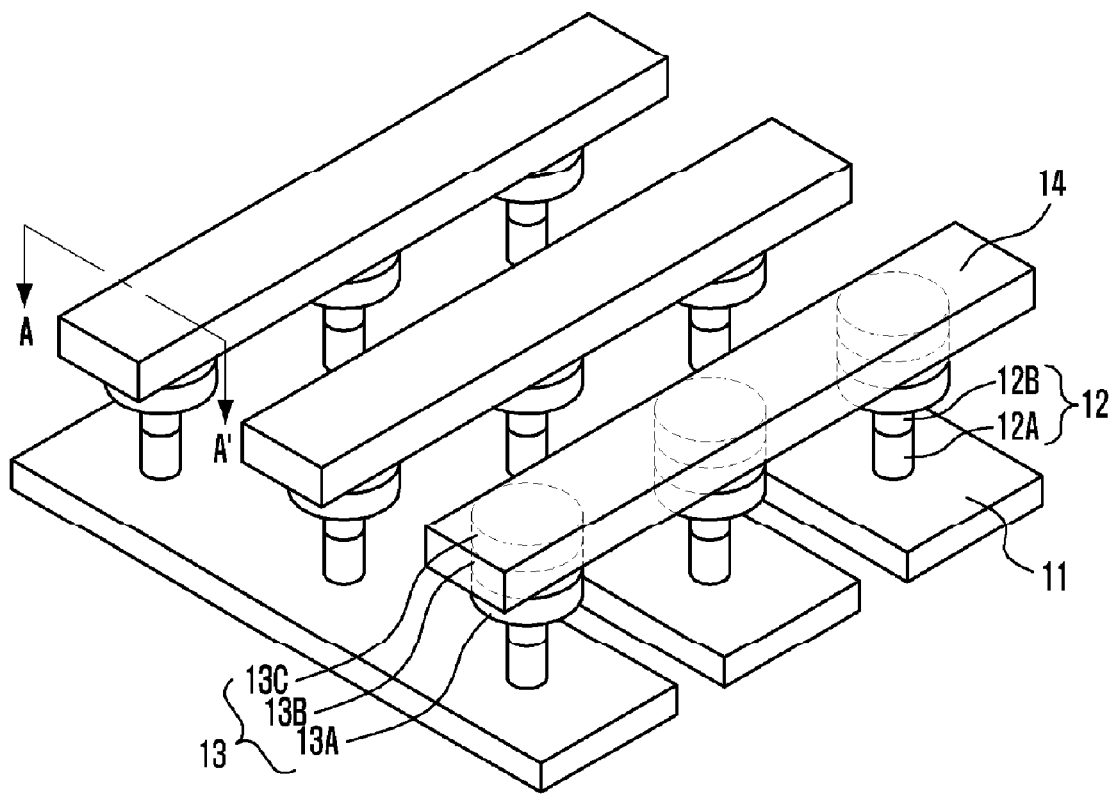
FIG. 1A is a perspective view of a resistive memory device in accordance with an embodiment.

In the figures, the dimensions of layers and regions are exaggerated for clarity of illustration. It will also be understood that when a layer is referred to as being "on/under" another layer or substrate, it can be directly on/under the other layer or substrate, or intervening layers may also be present. Likewise, when a layer is referred to as being 'between' two layers, it can be the only layer between the two layers, or one or more intervening layers may also be present. Like reference numerals refer to like elements throughout the drawings. In addition, different English alphabetical characters following a reference numeral of a layer refer to different states of the layer after one or more processing steps, such as an etch process or a polishing process.

Figure 1B:
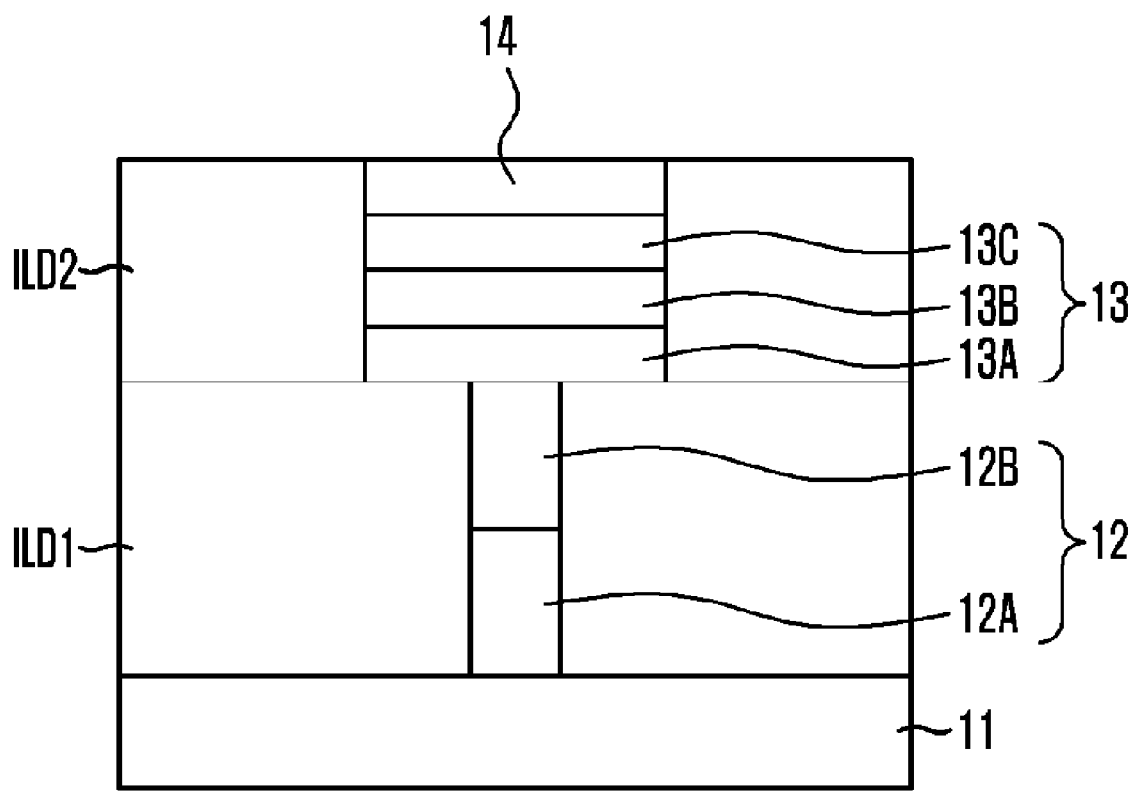
FIG. 1B is a cross-sectional view of the resistive memory device taken along a line A-A' in FIG. 1A.

FIG. 1A is a perspective view of a resistive memory device in accordance with an embodiment, and FIG. 1B is a cross-sectional view of the resistive memory device taken along a line A-A' in FIG. 1A. Particularly, these figures show a resistive memory device with a cross-point structure. The cross-point structure includes first conductive lines, second conductive lines crossing the first conductive lines and unit cells, each unit cell being interposed between one of the first conductive lines and one of the second conductive lines at their respective cross-point. Herein, the cross-point refers to each position where one of the first conductive lines and one of the second conductive lines cross each other. In some embodiments, the first conductive lines are parallel to each other and the second conductive lines are parallel to each other. Moreover, each unit cell includes a vertical selection diode and a resistive element. The cross-point structure has an advantage in that a highly integrated memory device can be obtained.

In FIGS. 1A and 1B, first conductive lines 11 are disposed over a substrate including a predetermined underlying structure (not shown). In some embodiments, the first conductive lines 11 are formed of a metal such as Al, W or Cu, and are arranged in parallel.

Second conductive lines 14 are disposed over the first conductive lines 11. The second conductive lines 14 are spaced apart from the first conductive lines 11 in a thickness or height direction of the memory device, and extend in a direction crossing the first conductive lines 11. In some embodiments, the second conductive lines 14 are formed of a metal such as Al, W or Cu, and are arranged in parallel.

A unit cell structure, wherein a vertical selection diode 12 used as a selection element and a resistive element 13 used as a data storage element are stacked one upon another, is interposed between the first conductive lines 11 and the second conductive lines 14 at each cross-point of the first conductive lines 11 and the second conductive lines 14. The cross-point refers to each position where one of the first conductive lines 11 and one of the second conductive lines 14 cross each other, as described above.

The vertical selection diode 12 is formed of a nanowire or a nanotube. Particularly, the nanowire in some embodiments is a semiconductor nanowire such as a Si nanowire, a SiGe nanowire, a Ge nanowire, a III-V group compound semiconductor nanowire or a II-VI group compound semiconductor nanowire, and the nanotube is a carbon nanotube. Moreover, in some embodiments, the vertical selection diode 12 includes a lower part 12A with n-type dopants and an upper part 12B with p-type dopants. In other embodiments, the vertical selection diode 12 includes a lower part with p-type dopants and an upper part with n-type dopants.

The resistive element 13 disposed over the vertical selection diode 12 includes a structure where a lower electrode 13A, a resistive layer 13B and an upper electrode 13C are stacked one upon another. In some embodiments, a material forming the lower electrode 13A and/or the upper electrode 13C is a metal such as Pt, Ni, W, Au, Cu, Ti, Zn, Al, Ta or Ir, and the resistive layer 13B is formed of a binary oxide or a metal-doped binary oxide where the metal dopants include Ti, Ni, Al, Au, Pt, Zn or Co. Because the resistive element 13 is formed, in some embodiments, through a patterning process while the vertical selection diode 12 is formed of a nanowire or a nanotube, a width of the resistive element 13 is greater than that of the vertical selection diode 12.

In the above resistive memory device, a diameter of a nanowire or a nanotube used as a selection element ranges from several nm to tens of nm so that the resistive memory device can be highly integrated which is advantageous. In addition, a diode formed of a semiconductor nanowire or a carbon nanotube has an increased current density and an improved rectifying characteristic as compared with the known diode formed of an oxide.

Reference numerals ILD1 and ILD2 represent interlayer dielectrics which are not shown in FIG. 1A for the sake of simplicity, but are shown in FIG. 1B.

Although not shown in the above figures, it is possible to omit, in some embodiments, the lower electrode 13A of the resistive memory device in FIGS. 1A and 1B. In this case, the vertical selection diode 12 functions not only as a selection element but also as a lower electrode, and the resistive layer 13B is in direct contact with the vertical selection diode 12.

The omission of the lower electrode 13A has the following advantages. A diameter of the vertical selection diode 12 formed of a nanowire or a nanotube is very small as it ranges from several nm to tens of nm. Therefore, a contact area between the vertical selection diode 12 and the resistive layer 13B decreases so that a reset current in the resistive memory device decreases.

When the resistive memory device is configured with a cross-point structure as described above, it is easy to implement a multi-stack structure including a plurality of layers stacked one upon another so that the resistive memory device can be much more highly integrated. Such a multi-stack structure will be described in detail with reference to FIGS. 2A and 2B, hereinafter.

Figure 2A:
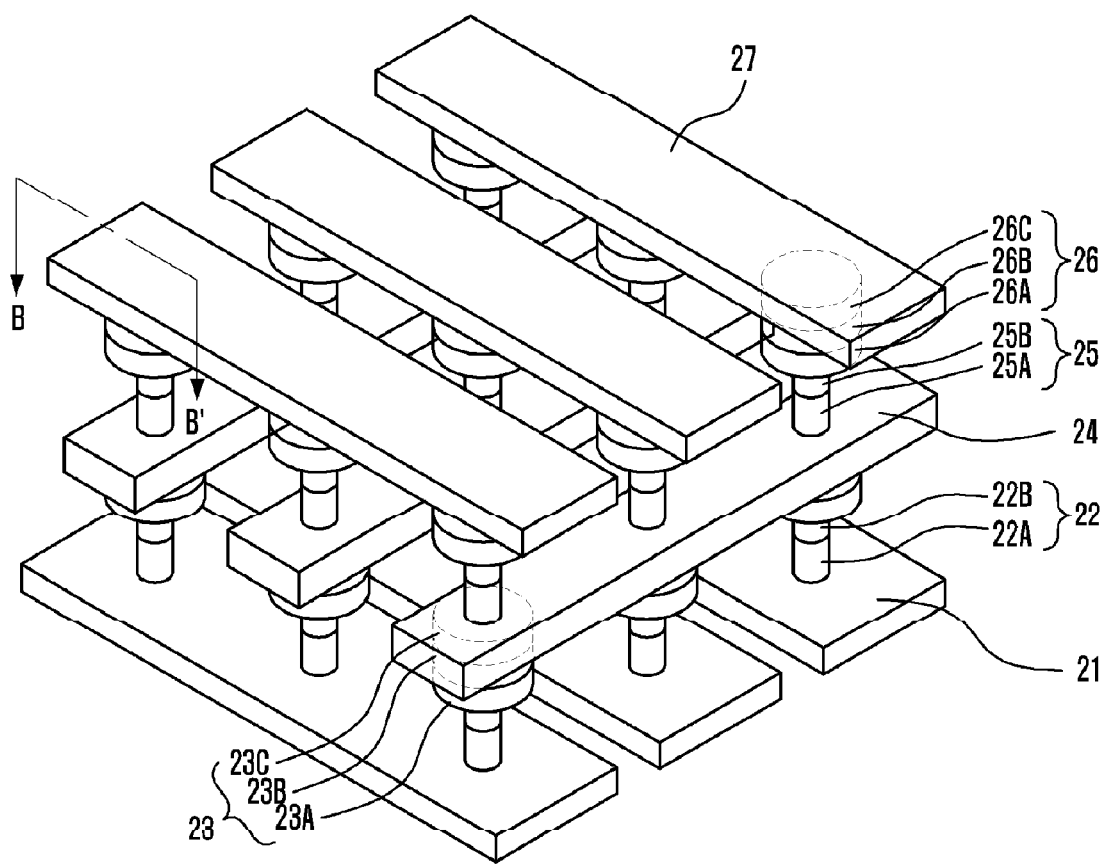
FIG. 2A is a perspective view of a resistive memory device in accordance with another embodiment.
Figure 2B:
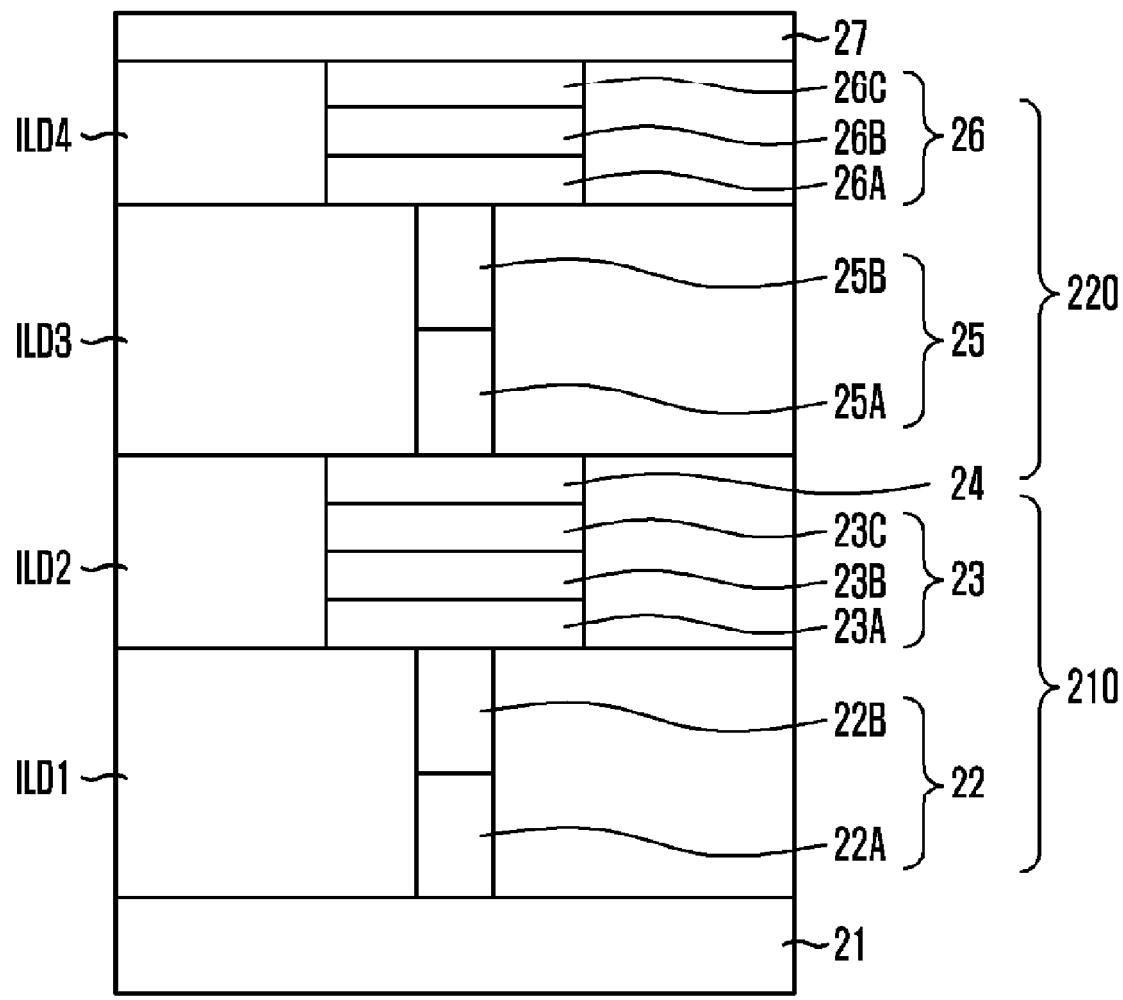
FIG. 2B is a cross-sectional view of the resistive memory device taken along a line B-B' in FIG. 2A.

FIG. 2A is a perspective view of a resistive memory device in accordance with another embodiment, and FIG. 2B is a cross-sectional view of the resistive memory device taken along a line B-B' in FIG. 2A. Particularly, these figures show a resistive memory device with a multi-stack structure.

In FIGS. 2A and 2B, a first stack 210 is similar to the resistive memory device described in FIGS. 1A and 1B in that it includes first conductive lines 21, a first vertical selection diode 22 formed of a nanowire or a nanotube and including of a first lower part 22A with n-type (or p-type) dopants and a first upper part 22B with p-type (or n-type) dopants, a first resistive element 23 formed by stacking a first lower electrode 23A, a first resistive layer 23B and a first upper electrode 23C one upon another, and second conductive lines 24 crossing the first conductive lines 21.

In some embodiments, a resistive memory device can include at least one more structure similar to the first stack 210.

For instance, a resistive memory device with two stacks is shown in these figures. Specifically, a second stack 220 is disposed over the first stack 210. The second stack 220 includes the second conductive lines 24, a second vertical selection diode 25 formed of a nanowire or a nanotube and including a second lower part 25A with n-type (or p-type) dopants and a second upper part 25B with p-type (or n-type) dopants, a second resistive element 26 formed by stacking a second lower electrode 26A, a second resistive layer 26B and a second upper electrode 26C one upon another, and third conductive lines 27 crossing the second conductive lines 24. In this embodiment, the second conductive lines 24 are used as common lines for the first stack 210 and the second stack 220.

In these figures, the resistive memory device with two stacks is shown, but this is not restrictive, the stack structure can be repeated. In other words, a resistive memory device may include more than three stacks in other embodiments.

Reference numerals ILD1, ILD2, ILD3 and ILD4 represent interlayer dielectrics which are not shown in FIG. 2A for the sake of simplicity, but are shown in FIG. 2B.

FIGS. 3A to 3F are cross-sectional views describing a method of fabricating a resistive memory device in accordance with still another embodiment. Particularly, these figures are illustrated based on the A-A' cross-section of FIG. 1A.

Figure 3A:
FIGS. 3A to 3F are cross-sectional views describing a method of fabricating a resistive memory device in accordance with still another embodiment.

In FIG. 3A, a first conductive line 31 is formed over a substrate including a predetermined underlying structure (not shown) by depositing a metal over the substrate and patterning the metal. Other conductive materials are not excluded. But, using the metal as the first conductive line 31 has an advantage in that a growth of a nanowire or a nanotube is easy.

Next, a first dielectric film 32A is formed over a whole resultant structure including the first conductive line 31.

Figure 3B:
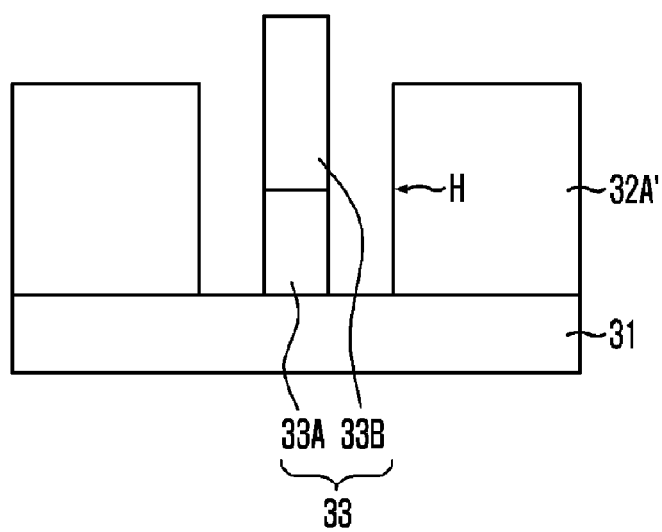

In FIG. 3B, a first dielectric film pattern 32A' with a hole (H) exposing the first conductive line 31 is formed by selectively etching the first dielectric film 32A in a region where a vertical selection diode is to be formed.

Next, a nanowire or a nanotube used as a vertical selection diode 33 is grown over the first conductive line 31 within the hole (H). An example of a method of growing the nanowire or the nanotube will be described hereafter. Firstly, a metal (not shown) used as a catalyst layer is deposited over the first conductive line 31 within the hole (H), wherein the metal is one selected from the group consisting of Ni, Fe, Co, Pt, Mo, W, Yt, Au, Pd, Ru and alloys thereof, and a thickness of the metal ranges from 3 nm to 50 nm. Then, the metal used as a catalyst layer is thermally treated, whereby quantum dots having a nm-size are formed. Then, the nanowire or the nanotube is grown by injecting a source gas on the quantum dots.

While growing the nanowire or the nanotube, the nanowire or the nanotube is doped with n-type dopants up to a predetermined partial height of the nanowire or the nanotube, and then, the nanowire or the nanotube is doped with p-type dopants from the predetermined partial height up to a predetermined target height of the nanowire or the nanotube. Therefore, the vertical selection diode 33 may include a lower part 33A with n-type dopants and an upper part 33B with p-type dopants.

Figure 3C:
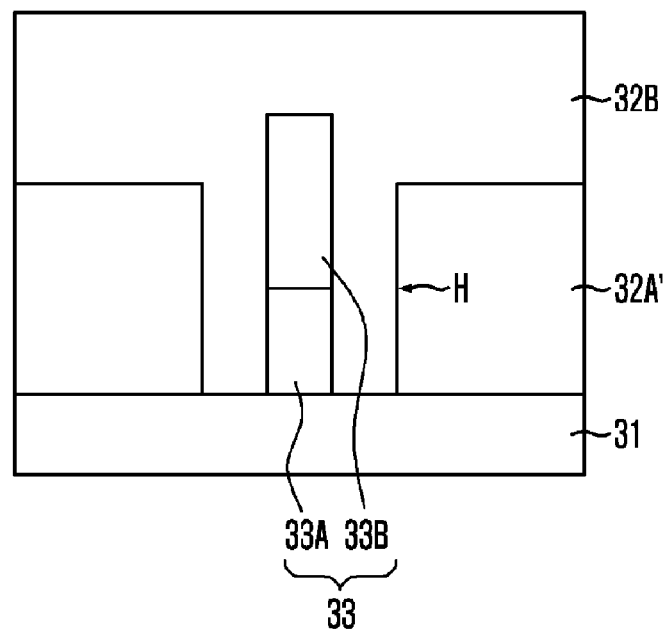

In FIG. 3C, a second dielectric film 32B is formed over a whole resultant structure including the vertical selection diode 33, whereby the hole (H) is filled with the second dielectric film 32B.

Figure 3D:
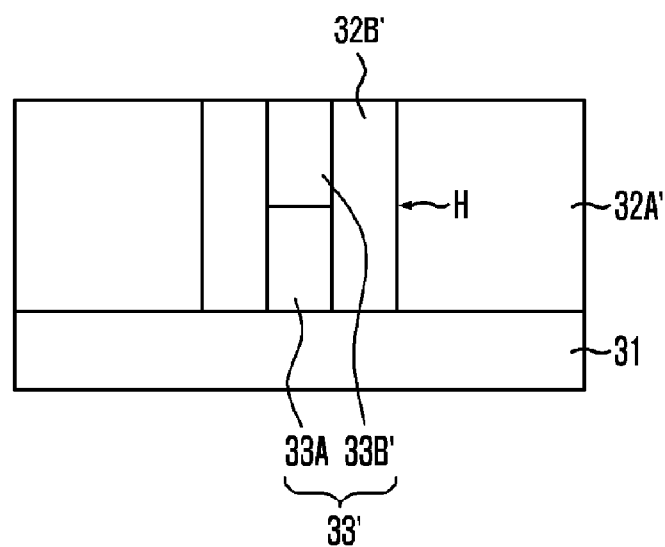

In FIG. 3D, a planarization process is performed on a resultant structure including the second dielectric film 32B and the vertical selection diode 33 until the first dielectric film pattern 32A' is exposed. Reference numerals 32b', 33b' and 33' represent the planarized second dielectric film, the upper part with p-type dopants, and the vertical selection diode, respectively.

Figure 3E:
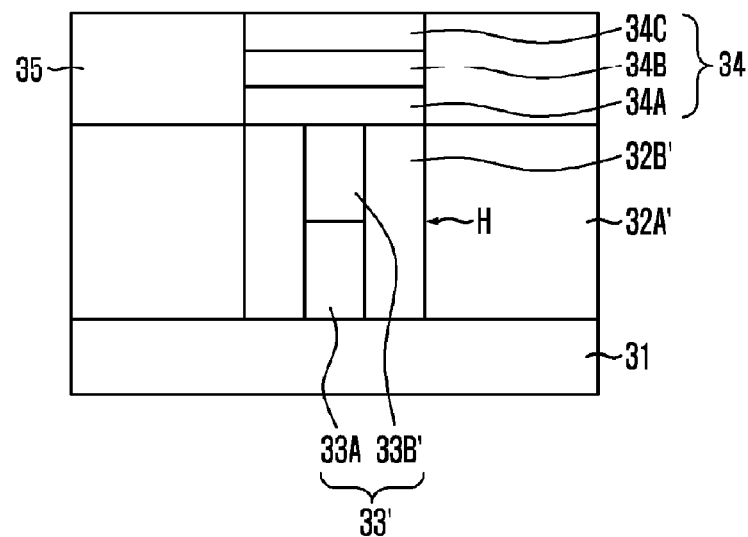

In FIG. 3E, a conductive film for a lower electrode, a material film for a resistive layer and a conductive film for an upper electrode are sequentially formed over a planarized resultant structure, and then patterned. Thus, a resistive element 34 including a structure where a lower electrode 34A, a resistive layer 34B and an upper electrode 34C are stacked one upon another is formed.

Next, a third dielectric film is formed over a whole resultant structure including the resistive element 34, and then a planarization process is performed on the third dielectric film until the upper electrode 34C is exposed. Thus, a third dielectric film pattern 35 is formed.

Figure 3F:
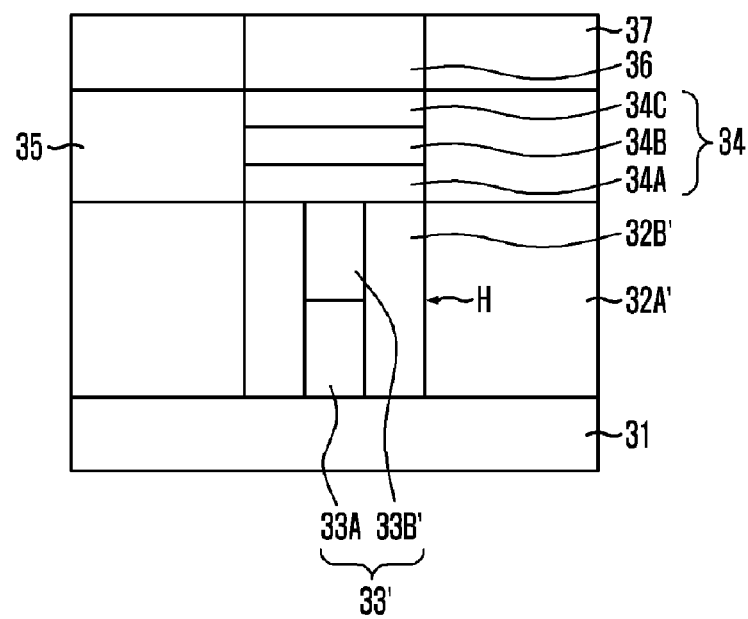

In FIG. 3F, a second conductive line 36 is formed over a planarized resultant structure by depositing a metal over the planarized resultant structure and patterning the metal, wherein the second conductive line 36 extends in a direction crossing the first conductive line 31.

Next, a fourth dielectric film is formed over a whole resultant structure including the second conductive line 36, and then a planarization process is performed on the fourth dielectric film until the second conductive line 36 is exposed. Thus, a fourth dielectric film pattern 37 is formed.

A resistive memory device with a multi-stack structure described above can be fabricated by repeating processes described in FIGS. 3A to 3F.

Figure 4A:
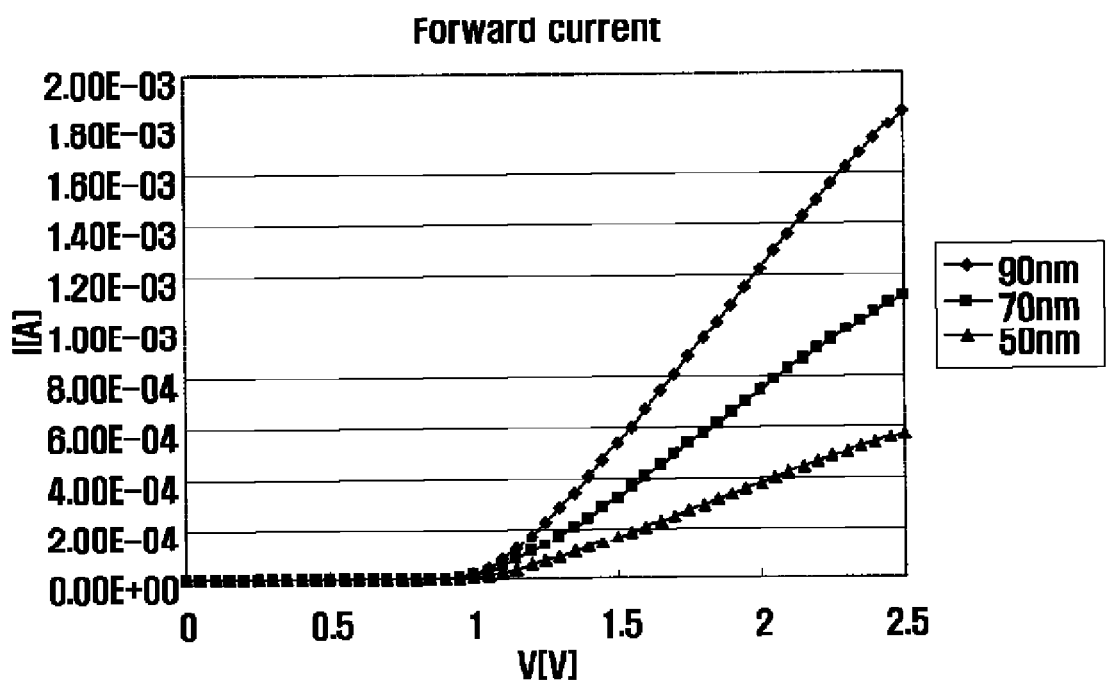
FIGS. 4A and 4B are I-V graphs showing characteristics of a vertical diode according to an embodiment.
Figure 4B:
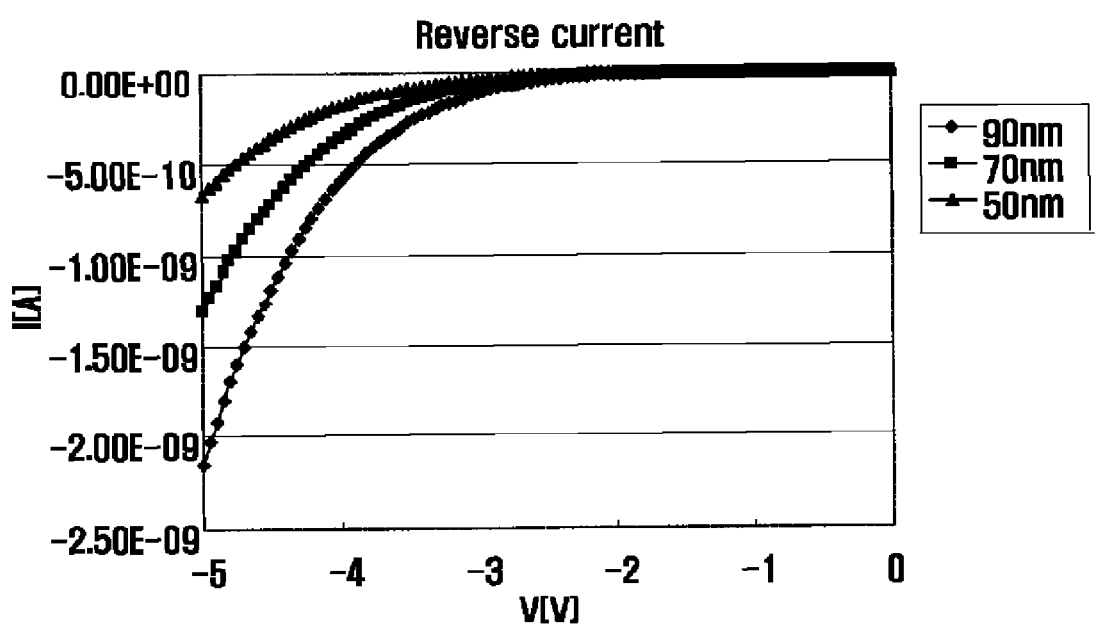

FIGS. 4A and 4B are I-V graphs showing characteristics of a vertical selection diode according to an embodiment. Particularly, characteristics of a Si nanowire diode are shown.

In FIGS. 4A and 4B, a range of a forward current and a range of a reverse current of the Si nanowire diode are shown.

The resistive memory device and the method of fabricating the same as described above can increase a current density through a vertical selection diode and improve a rectifying characteristic through the vertical selection diode, and moreover, highly integrate the resistive memory device by forming the vertical selection diode using a nanotube or a nanowire.

While exemplary embodiments have been described, the embodiments are illustrative and not limitative. It will be apparent to those skilled in the art that various changes and modifications may be made.

What is claimed is:

1. A resistive memory cell, comprising: a first conductive line on a substrate; a selection diode comprising a vertical nanotube and being arranged over the first conductive line; a resistive element including a resistive layer arranged over the selection diode; and a second conductive line arranged over the resistive element; wherein the vertical nanotube includes a carbon nanotube.

2. The memory cell of claim 1, wherein the first conductive line or the second conductive line is formed of a metal.

3. The memory cell of claim 1, wherein the selection diode includes a lower part with n-type or p-type dopants and an upper part with p-type or n-type dopants, respectively.

4. The memory cell of claim 1, wherein the resistive element includes a lower electrode arranged on and in electrical contact with the selection diode, the resistive layer arranged on the lower electrode, and an upper electrode arranged on the resistive layer and in electrical contact with the second conductive line.

5. The memory cell of claim 1, wherein the resistive element include the resistive layer arranged on and in direct electrical contact with the selection diode, and an upper electrode arranged on the resistive layer and in electrical contact with the second conductive line.

6. A resistive memory device with a cross-point structure, the device comprising: first conductive lines arranged in parallel over a substrate; second conductive lines arranged in parallel, spaced upwardly from the first conductive lines and extending across the first conductive lines; and a plurality of first resistive memory cells each being interposed between one of the first conductive lines and one of the second conductive lines at a cross-point of the first conductive line and the second conductive line, each first resistive memory cell comprising a first selection diode and a first resistive element stacked one upon another; wherein the first selection diode comprises a nanotube, and the first resistive element includes a first resistive layer; and wherein the vertical nanotube includes a carbon nanotube.

7. The device of claim 6, wherein the first conductive lines or the second conductive lines are formed of a mental.

8. The device of claim 6, wherein the first selection diode includes a lower part with n-type or p-type dopants and an upper part with p-type or n-type dopants, respectively.

9. The device of claim 6, wherein the first resistive element includes a first lower electrode arranged on and in electrical contact with the first selection diode, the first resistive layer arranged on the first lower electrode, and a first upper electrode arranged on the first resistive layer and in electrical contact with the respective second conductive line.

10. The device of claim 6, wherein the first resistive element includes the first resistive layer arranged on and in direct electrical contact with the first selection diode, and a first upper electrode arranged on the first resistive layer and in electrical contact with the respective second conductive line.

11. The device of claim 6, further comprising: third conductive lines arranged in parallel, spaced upwardly from the second conductive lines and extending across the second conductive lines; and a plurality of second resistive memory cells each being interposed between one of the second conductive lines and one of the third conductive lines at a cross-point of the second conductive line and the third conductive line, each second resistive memory cell comprising a second selection diode and a second resistive element stacked one upon another; wherein the second selection diode comprises a vertical nanotube, and the second resistive element includes a second resistive layer.

12. A method of fabricating a resistive memory device, the method comprising: forming a first conductive line over a substrate; forming a selection diode by growing a vertical over the first conductive line; forming a resistive element including a resistive layer over the selection diode; and forming a second conductive line over the resistive element; wherein the vertical nanotube includes a carbon nanotube.

13. The method of claim 12, wherein the forming of the first conductive line or the forming of the second conductive line is performed by depositing a metal and patterning the metal.

14. The method of claim 12, wherein the forming of the selection diode comprises: growing the vertical nanotube while doping upper and lower parts of the vertical nanotube being grown with dopants of different conductivity types.

15. The method of claim 12, wherein the forming of the selection diode comprises: forming a patterned first dielectric layer over the substrate including the first conductive line formed thereon to expose a region of the first conductive line where the vertical nanotube is to be grown; forming a metal catalyst layer over said exposed region of the first conductive line; and growing the vertical nanotube based on the metal catalyst layer.

16. The method of claim 15, wherein the forming of the resistive element comprises: forming a second dielectric layer over the substrate including the grown vertical nanotube; planarizing the second dielectric layer until the upper part of the vertical nanotube is exposed; and stacking at least the resistive layer and an upper conductive film defining an upper electrode on the exposed upper part of the vertical nanotube to form the resistive element.

17. The method of claim 16, wherein the stacking further comprises: forming a lower conductive film defining a lower electrode on the exposed upper part of the vertical nanotube before stacking the resistive layer and the upper conductive film on the lower conductive film.

18. The method of claim 12, further comprising: forming a further selection diode by growing a further vertical nanotube over the second conductive line; forming a further resistive element including a further resistive layer over the further selection diode; and forming a third conductive line over the further resistive element.

* * * * *